(12) United States Patent
Johansson et al.

(10) Patent No.: US 8,409,696 B2
(45) Date of Patent: Apr. 2, 2013

(54) MULTILAYERED COATED CUTTING TOOL

(75) Inventors: Mats Johansson, Linkoping (SE); Jacob Sjölén, Fagersta (SE); Magnus Odén, Tullinge (SE); Axel Knutsson, Linkoping (SE)

(73) Assignee: Seco Tools AB, Fagersta (SE)

( * ) Notice: Subject to any disclaimer, the term of this patent is extended or adjusted under 35 U.S.C. 154(b) by 118 days.

(21) Appl. No.: 12/867,889

(22) PCT Filed: Feb. 19, 2009

(86) PCT No.: PCT/SE2009/050185
§ 371 (c)(1),
(2), (4) Date: Dec. 22, 2010

(87) PCT Pub. No.: WO2009/105024
PCT Pub. Date: Aug. 27, 2009

(65) Prior Publication Data
US 2011/0111197 A1    May 12, 2011

(30) Foreign Application Priority Data
Feb. 21, 2008  (SE) ...................................... 0800398

(51) Int. Cl.
*B32B 9/00* (2006.01)

(52) U.S. Cl. ....... 428/216; 51/307; 51/309; 204/192.15; 204/192.16; 428/336; 428/697; 428/698; 428/699

(58) Field of Classification Search ................ 51/307, 51/309; 428/216, 336, 697, 698, 699; 204/192.15, 204/192.16
See application file for complete search history.

(56) References Cited

U.S. PATENT DOCUMENTS
5,330,853 A    7/1994  Hofmann et al.
5,503,912 A    4/1996  Setoyama et al.
(Continued)

FOREIGN PATENT DOCUMENTS
JP    6-136514 A     5/1994
JP    2002-263941 A  9/2002

OTHER PUBLICATIONS

Ducros et al "Multilayered and nanolayered hard nitride thin films deposited by cathidc arc evaporation. Part 1: Deposition, morphology and microstructure" Surface & Coatings Techn 201 (2006) p. 136-142.*

(Continued)

*Primary Examiner* — Archene Turner
(74) *Attorney, Agent, or Firm* — Young & Thompson

(57) ABSTRACT

A cutting tool includes a body of a hard alloy of cemented carbide, cermet, ceramics, cubic boron nitride based material or high speed steel and on which at least one of the functioning parts of the surface thereof, a hard and wear resistant coating is applied. The coating includes a polycrystalline laminar, multilayered structure of metal nitride compounds, in a repetitive form . . . MeN/(Ti$_{1-x}$Al$_x$)N/MeN/(Ti$_{1-x}$Al$_x$)N/ MeN/(Ti$_{1-x}$Al$_x$)N/MeN/(Ti$_{1-x}$Al$_x$)N . . . of cubic structured (Ti$_{1-x}$Al$_x$)N layers where $0.3<x<0.95$ and cubic structured MeN layers where Me is one or more of the metal element Ti, Zr, Hf, V, Nb, Ta, Mo and Al. The laminated structure has a repeat period, λ, of $5\,\text{nm} \leq \lambda < 20\,\text{nm}$, a layer thickness relation of $1/10 < (d_{MeN}/d_{(Ti,Al)N}) < 1/3$ and a thickness $d_{MeN} \geq 1$ nm that is essentially constant throughout its total thickness up to 20 µm. The coating hardens as a nanocomposite, adapting its strength during spinodal decomposition of (Ti$_{1-x}$Al$_x$)N in cubic TiN and cubic AlN domains where the additional cubic structured MeN layers provides elements for locking a predominantly overall cubic coating structure thus suppressing the hexagonal AlN phase formation leading to improved high temperature metal cutting properties.

21 Claims, 4 Drawing Sheets

U.S. PATENT DOCUMENTS

| | | | |
|---|---|---|---|
| 6,077,596 | A | 6/2000 | Hashimoto et al. |
| 6,103,357 | A | 8/2000 | Selinder et al. |
| 6,254,984 | B1 | 7/2001 | Iyori |
| 6,309,738 | B1 | 10/2001 | Sakurai |
| 6,660,133 | B2 * | 12/2003 | Penich et al. ............ 204/192.16 |
| 6,811,581 | B2 * | 11/2004 | Yamada et al. ................. 51/307 |
| 7,056,602 | B2 | 6/2006 | Horling et al. |
| 7,083,868 | B2 | 8/2006 | Horling et al. |
| 2002/0081161 | A1 | 6/2002 | Yamada et al. |
| 2004/0026236 | A1 | 2/2004 | Penich et al. |

OTHER PUBLICATIONS

Ducros et al "Multilayered and nanolayered hard nitride thin films deposited by cathidc arc evaporation. Part 2: Mechanical properties and cutting performances" Surface & Coatings Techn 201 (2006) p. 1045-1052.*

International Search Report, dated May 7, 2009, from the corresponding PCT application.

* cited by examiner

MULTILAYERED COATED CUTTING TOOL

BACKGROUND OF THE INVENTION

1. Field of the Invention

The present invention relates to a tool for machining by chip removal comprising a body of a hard alloy of cemented carbide, cermet, ceramics, cubic boron nitride based material or high speed steel and a hard and wear resistant metal nitride coating comprising alternating cubic structured (Ti,Al)N layers and cubic structured MeN layers, where Me is one or more of the metal elements Ti, Zr, Hf, V, Nb, Ta, Mo and Al. The coating is grown by physical vapour deposition (PVD) and preferably by cathodic arc evaporation. This invention is particularly useful in metal cutting applications generating high temperatures, e.g., machining of super alloys and stainless steel.

2. Description of the Related Art

Since the early 1980's, TiN-layers have been widely used for surface protective applications. In order to improve the oxidation resistance of these coatings, work began in the mid-1980's with adding aluminium to TiN [see e.g. H. A. Jehn, et al, J. Vac. Sci. Technol. A 4, 2701 (1986) and O. Knotek et. al, J. Vac. Sci. Technol. A 4, 2695 (1986)]. The compound thus formed, cubic-phase (Ti,Al)N, was found to have superior oxidation resistance and enabled greater cutting speeds during machining, prolonged tool life, machining of harder materials, and improved manufacturing economy. Improved coating performance in metal cutting applications has been obtained by precipitation hardening of (Ti,Al)N [see e.g. A. Hörling et al, Surf. Coat. Tech. 191 (2005)] and also disclosed in U.S. Pat. Nos. 7,083,868 and 7,056,602.

Coating optimization has also been obtained by applying different concepts of multilayer as; alternating Ti and Al containing layers (U.S. Pat. No. 6,309,738), oxygen and non-oxygen containing layers (U.S. Pat. No. 6,254,984), one of the layers stacked in the multilayer consists itself of a multilayer (U.S. Pat. No. 6,077,596), alternating nitrogen content (U.S. Pat. No. 5,330,853) or using one metastable compound (U.S. Pat. No. 5,503,912) or as aperiodic multilayer (U.S. Pat. No. 6,103,357).

JP 6136514 discloses a wear resistant multilayered hard coating structure comprising alternating layers of Ti(C, N) and (Al, Ti)(C, N) on the surface of the tool. The coating is deposited by PVD at a relatively low temperature.

The trends towards dry-work processes for environmental protection, i.e., metal cutting operation without using cutting fluids (lubricants) and accelerated machining speed with improved process put even higher demands on the characteristics of the tool materials due to an increased tool cutting-edge temperature. In particular, coating stability at high temperatures, e.g., oxidation- and wear-resistance have become even more crucial.

SUMMARY OF THE INVENTION

It is an object of the present invention to provide a coated cutting tool yielding improved performance in metal cutting applications at elevated temperatures.

Surprisingly, we have found that by combining two different cubic structured materials in a multilayered coating leads to improved high temperature metal cutting properties. The coating hardens as a nanocomposite, adapting its strength during spinodal decomposition of (Ti,Al)N in cubic TiN and cubic AlN domains where the additional MeN layers provide means for locking a predominantly overall cubic coating structure (as measured by X-ray diffraction) thus suppressing the detrimental hexagonal AlN phase formation otherwise occurring.

DETAILED DESCRIPTION OF THE INVENTION

Figure 1A:
FIG. 1a; Schematic coating structure showing (1) body, (2) multilayer coating, (3) MeN layer, (4) (Ti,Al)N layer and (5) the repeat period λ.

According to the present invention, there is provided a cutting tool for machining by chip removal comprising a body of a hard alloy of cemented carbide, cermet, ceramics, cubic boron nitride based material or high speed steel on which a hard and wear resistant coating is applied comprising a polycrystalline laminar, multilayered structure of metal nitride compounds, in a repetitive form (see FIG. 1a) . . . MeN(3)/(Ti$_{1-x}$Al$_x$)N(4)/MeN(3)/(Ti$_{1-x}$Al$_x$)N(4)/MeN(3)/(Ti$_{1-x}$Al$_x$)N(4)/MeN(3)/ . . . of cubic structured (Ti$_{1-x}$Al$_x$)N layers $0.3<x<0.95$, preferably $0.45<x<0.75$ and cubic structured MeN layers where Me is one or more of the metal elements Ti, Zr, Hf, V, Nb, Ta, Mo and Al, preferably Ti, V, Nb, Ta and Al.

Said laminar structure has a total thickness of 0.5 to 20 μm, preferably 1 to 10 μm and most preferably 2 to 5 μm. The repeat period λ, (5) in FIG. 1a, i.e., the total thickness of the bi-layer $d_{MeN}+d_{(Ti,Al)N}$, is essentially constant throughout the entire multi layer structure (that is, it varies by no more than 20%). The repeat period is 5 nm≦λ≦20 nm, preferably 5 nm≦λ≦10 nm with $1/10<(d_{MeN}/d_{(Ti,Al)N})<1/3$ and where the thickness $d_{MeN}$ is larger than $d_{MeN}≧1$ nm.

In a first embodiment Me is Ti.
In a second embodiment Me is Zr.
In a third embodiment Me is V.
In a forth embodiment Me is Nb.
In a fifth embodiment Me is Ta.
In a sixth embodiment Me is Al.

In a seventh embodiment Me is two or more of the metal elements Ti, V, Nb or Al.

In an eighth embodiment Me is two or more of the metal elements V, Nb or Al.

In a ninth embodiment Me is two or more of the metal elements Ti, Zr, V or Nb.

In a tenth embodiment Me is two or more of the metal elements Zr, V or Nb.

Figure 1B:
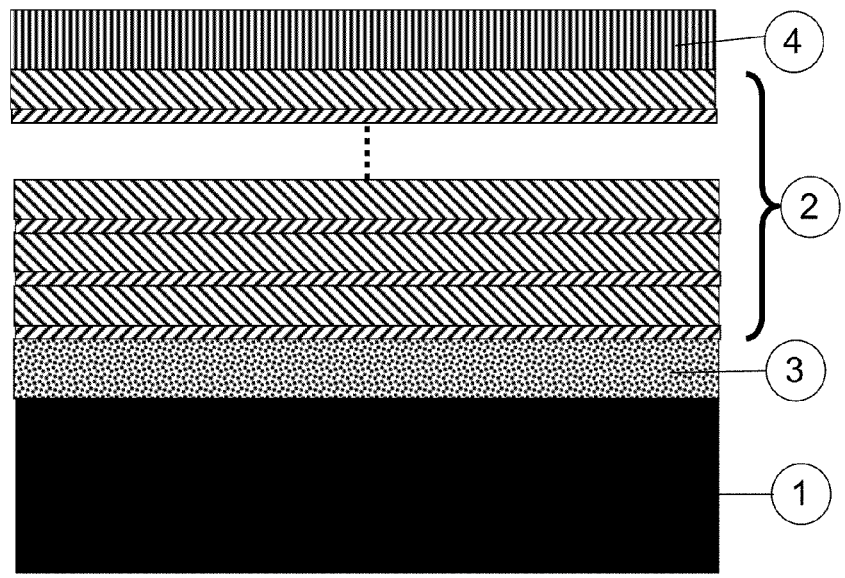
FIG. 1b; Schematic coating structure showing (1) body, (2) inner single- and/or multilayer coating according to prior art, (3) multilayer coating according to the invention and (4) outer single- and/or multilayer coating according to prior art.

Said body (1) in FIG. 1b may be coated with an inner (3) single- and/or multilayer coating of TiN, TiC, Ti(C,N) or (Ti,Al)N, preferably (Ti,Al)N and/or an outer (4) single- and/or multilayer coating of TiN, TiC, Ti(C,N) or (Ti,Al)N, preferably (Ti,Al)N, to a total coating thickness 1 to 20 μm, preferably 1 to 10 μm and most preferably 2 to 7 μm according to prior art.

The MeN layer has a compressive stress level between $-12.0 < \sigma(MeN) < -3.0$ GPa, preferably between $-12.0 < \sigma(MeN) < -8.0$ GPa whereas the $(Ti_{1-x}Al_x)N$ layer has a stress level varying between $-6.0 < \sigma((Ti_{1-x}Al_x)N) < -0.5$ GPa, preferably between $-6.0 < \sigma((Ti_{1-x}Al_x)N) < -3.0$ GPa.

The average composition of the MeN/$(Ti_{1-x}Al_x)N$ multilayer coating is 46 at %<Zr+Hf+V+Nb+Ta+Mo+Ti+Al<54 at %, preferably 48 at %<Zr+Hf+V+Nb+Ta+Mo+Ti+Al<52 at % and balanced N.

The coating process of the present invention is based on cathodic arc evaporation of pure and/or alloyed cathodes under the following conditions; $(Ti_{1-x}Al_x)N$ layers are grown using Ti/Al-cathodes with a composition between (70 at % Ti+30 at % Al) and (5 at % Ti+95 at % Al) and preferably between (40 at % Ti+60 at % Al) and (30 at % Ti+70 at % Al). The MeN layers are grown using pure or alloyed cathodes where Me is one or more of the metal elements Ti, Zr, Hf, V, Nb, Ta, Mo and Al, preferably one or more of Ti, V, Nb, Ta or Al. The evaporation current is between 50 A and 200 A depending on the cathode size and preferably between 50 A and 100 A using cathodes of 63 mm in diameter. The layers are grown in an Ar+$N_2$ atmosphere, preferably in a pure $N_2$ atmosphere, at a total pressure of 0.5 Pa to 9.0 Pa, preferably 1.5 Pa to 5.0 Pa. The bias is −10 V to −300 V, preferably −20 V to −100V. The deposition temperature is between 350° C. and 700° C., preferably between 400° C. and 650° C.

The invention also relates to the use of cutting tool inserts according to the above for machining of stainless steel and super alloys at cutting speeds of 50-400 m/min, preferably 75-300 m/min, with an average feed, per tooth in the case of milling, of 0.08-0.5 mm, preferably 0.1-0.4 mm depending on cutting speed and insert geometry.

EXAMPLE 1

Cemented carbide inserts with composition 94 wt % WC-6 wt % Co (WC grain size of 0.8 μm) were used.

Before deposition, the inserts were cleaned in ultrasonic baths of an alkali solution and alcohol. The system was evacuated to a pressure of less than $2.0 \times 10^{-3}$ Pa, after which the inserts were sputter cleaned with Ar ions. TiN/$(Ti_{1-x}Al_x)N$ layers were grown using cathodic arc evaporation. The cathode materials for $(Ti_{1-x}Al_x)N$ was Ti/Al (33 at % Ti+67 at % Al), 63 mm in diameter (position (2a) in FIG. 2a) and for the TiN layers, pure Ti (63 mm in diameter, position (2b) in FIG. 2a) was used. The layers were deposited in 99.995% pure $N_2$ atmosphere at a total pressure of 4 Pa, using a bias of −40 V and an evaporation current of 60 A for both cathode materials. The variation in layer thicknesses was obtained by altering the evaporation current to the cathodes, the set-up of the deposition system (i.e., the cathode material in the four positions (2), see FIG. 2b) and the rotation speed of the fixture (see tab 1). The total coating thickness was close to 3 μm for all inserts. The deposition temperature was about 450° C.

Figure 3:
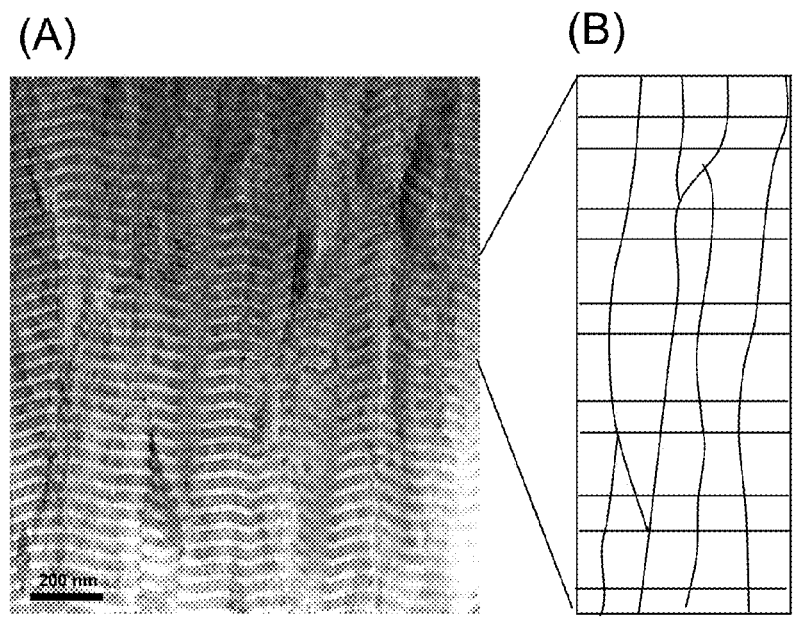
FIG. 3; (A) Cross sectional STEM micrograph of a coating with TiN (bright contrast) and (Ti,Al)N (dark contrast) and (B) schematic representation of the grain structure of a typical multilayer coating according to this invention.

Cross-sectional transmission electron microscopy (TEM) including scanning TEM (STEM) was used to study the microstructure of the layers. The sample preparation comprised standard mechanical grinding/polishing and ion-beam sputter etching on both upper and lower surfaces as well as cut-out of TEM samples by using focused ion beam (FIB) milling over the cutting edge of the inserts. FIG. 3 (A) is a cross sectional STEM micrograph of a multilayer coating with TiN (bright contrast) and $(Ti_{0.36}Al_{0.64})N$ (dark contrast). The microstructure is columnar and dense, with large single crystal grains over several interfaces (schematically shown in (B)).

Figure 4:
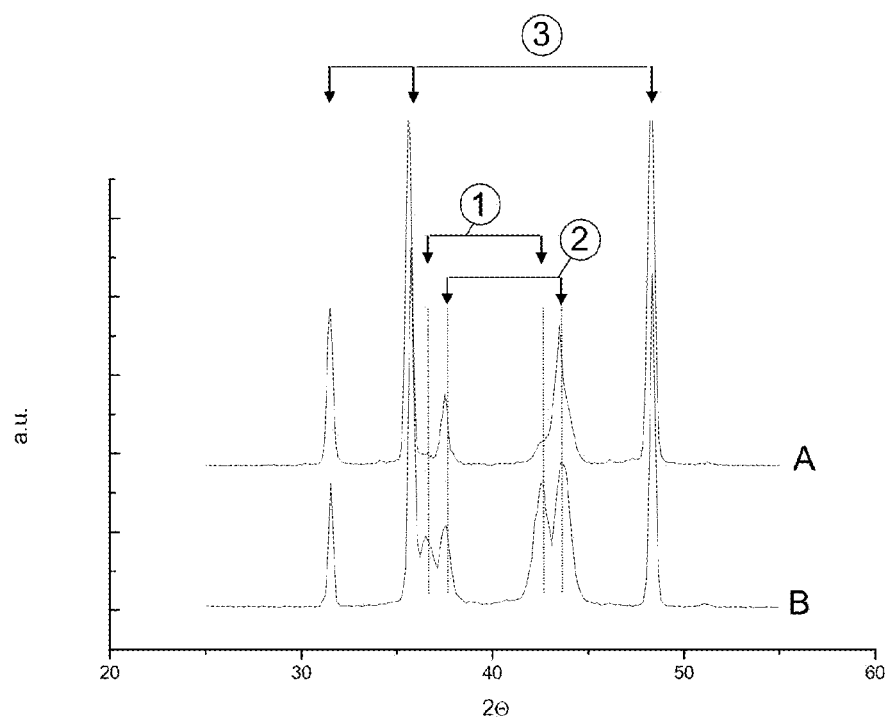
FIG. 4; X-ray diffraction patterns obtained from (A) a pure (Ti,Al)N layer and (B) a multilayer TiN/(Ti,Al)N coating according to the invention. The diffraction peaks are indexed as (1) TiN, (2) (Ti,Al)N and (3) cemented carbide.

The XRD patterns of the as-deposited layers were obtained using Cu K alpha radiation and a θ-2θ configuration. FIG. 4 shows XRD patterns of (A) single phase $(Ti_{0.36}Al_{0.64})N$ layer and (B) multilayered TiN/(Ti,Al)N coating with TiN and $(Ti_{0.36}Al_{0.64})N$. The indexed peaks correspond to single phase (1) TiN, (2) (Ti,Al)N and (3) cemented carbide. Similar to the results in FIG. 4, all deposited coatings summarized in tab 1 reveal single-phase cubic TiN and (Ti,Al)N structures.

Figure 5:
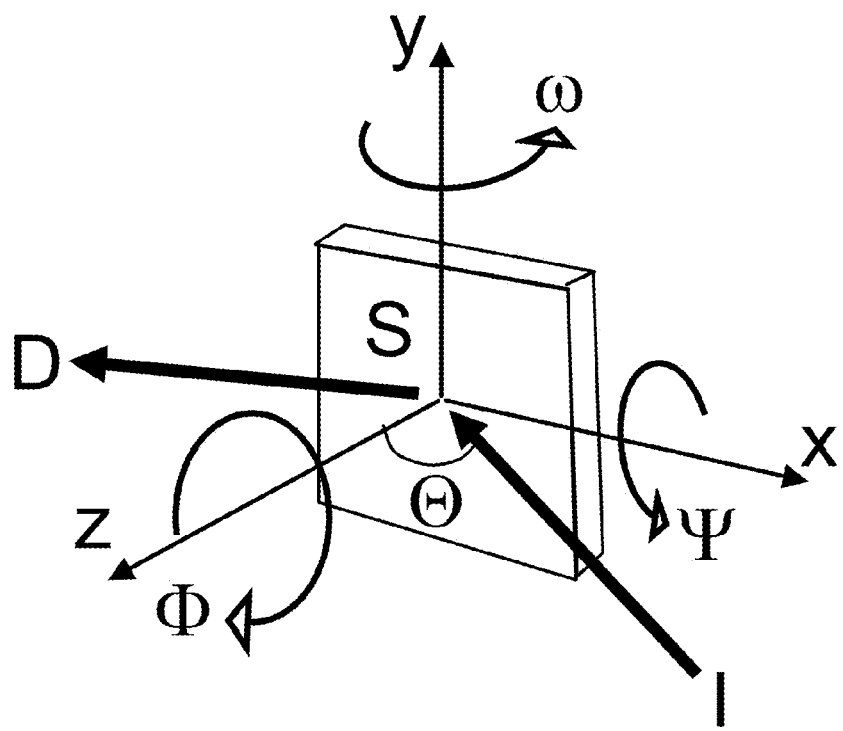
FIG. 5; Schematic of the set-up used for residual stress, σ, analysis by XRD

The residual stresses, σ, of the TiN and $(Ti_{1-x}Al_x)N$ layers of the coating were evaluated by XRD measurements (see tab 1) using the $\sin^2 \psi$ method. The measurements were performed using CuKα-radiation on the TiN 220- and the $(Ti_{1-x}Al_x)N$ 220-reflections, respectively. Stress values for layers thinner than <4 nm could not be deduced. The goniometer setup is shown in FIG. 5. Data was obtained using the side-inclination technique (ψ-geometry) with 11, ψ-angles (positive and negative), equidistant within a $\sin^2 \psi$ range of 0 to 0.82 (ψ~65°). The residual stress values were evaluated using a Possion's ratio of ν=0.25 and Young's modulus of E=450 GPa.

The total average composition of the coatings was estimated by energy dispersive spectroscopy (EDS) analysis area using a LEO Ultra 55 scanning electron microscope with a Thermo Noran EDS detector operating at 10 kV. The data were evaluated using a Noran System Six (NSS ver 2) software (see tab 1).

TABLE 1

| Sample | $d_{TiN}$ (nm) | $d_{(Ti,Al)N}$ (nm) | λ (nm) | N | Total coating thickness (μm) | $\sigma_{TiN}$ (GPa) | $\sigma_{(Ti,Al)N}$ (GPa) | Ti (at %) | Al (at %) | N (at %) |
|---|---|---|---|---|---|---|---|---|---|---|
| (Ti, Al)N | | | | | 2.9 | | −3.6 | 18.3 | 31.7 | 50.0 |
| TiN | | | | | 3.2 | −3.5 | | 49.5 | | 50.5 |
| ... TiN/Ti, Al)N/ ... | | | | | | | | | | |
| 1 | 1.1 | 4.0 | 5.1 | 569 | 2.9 | | −5.5 | 24.8 | 25.1 | 50.1 |
| 2 | 2.4 | 2.5 | 4.9 | 633 | 3.1 | | | 33.4 | 16.3 | 50.2 |
| 3 | 3.9 | 0.9 | 4.8 | 625 | 3.0 | | −7.5 | 43.6 | 6.0 | 50.4 |

TABLE 1-continued

| Sample | $d_{TiN}$ (nm) | $d_{(Ti,Al)N}$ (nm) | $\lambda$ (nm) | N | Total coating thickness (μm) | $\sigma_{TiN}$ (GPa) | $\sigma_{(Ti,Al)N}$ (GPa) | Ti (at %) | Al (at %) | N (at %) |
|---|---|---|---|---|---|---|---|---|---|---|
| 4 | 2.0 | 7.9 | 9.9 | 313 | 3.1 | | −4.2 | 24.4 | 25.5 | 50.1 |
| 5 | 5.1 | 5.0 | 10.1 | 287 | 2.9 | −8.7 | −2.1 | 33.9 | 15.8 | 50.3 |
| 6 | 8.1 | 2.1 | 10.2 | 294 | 3.0 | −6.6 | | 43.0 | 6.6 | 50.4 |
| 7 | 4.1 | 15.9 | 20.0 | 163 | 3.3 | −11.1 | −4.3 | 24.5 | 25.4 | 50.1 |
| 8 | 10.4 | 10.1 | 20.5 | 161 | 3.3 | −9.6 | −3.8 | 34.0 | 15.8 | 50.3 |
| 9 | 16.2 | 3.8 | 20.0 | 168 | 3.4 | −7.5 | −1.0 | 43.5 | 6.1 | 50.4 |
| 10 | 10.1 | 39.5 | 49.6 | 69 | 3.4 | −10.7 | −4.2 | 24.4 | 25.5 | 50.1 |
| 11 | 24.8 | 25.1 | 49.9 | 69 | 3.5 | −9.7 | −2.3 | 33.7 | 16.1 | 50.2 |
| 12 | 40.2 | 10.1 | 50.3 | 70 | 3.5 | −8.2 | −1.0 | 43.2 | 6.4 | 50.4 |
| 13 | 21.5 | 79.0 | 100.5 | 35 | 3.6 | −10.5 | −6.4 | 24.7 | 25.2 | 50.1 |
| 14 | 49.2 | 50.4 | 99.6 | 36 | 3.6 | −8.8 | −4.4 | 33.6 | 16.2 | 50.2 |
| 15 | 81.2 | 19.2 | 100.4 | 36 | 3.7 | −6.2 | −0.9 | 43.5 | 6.1 | 50.4 |

EXAMPLE 2

Figure 2A:
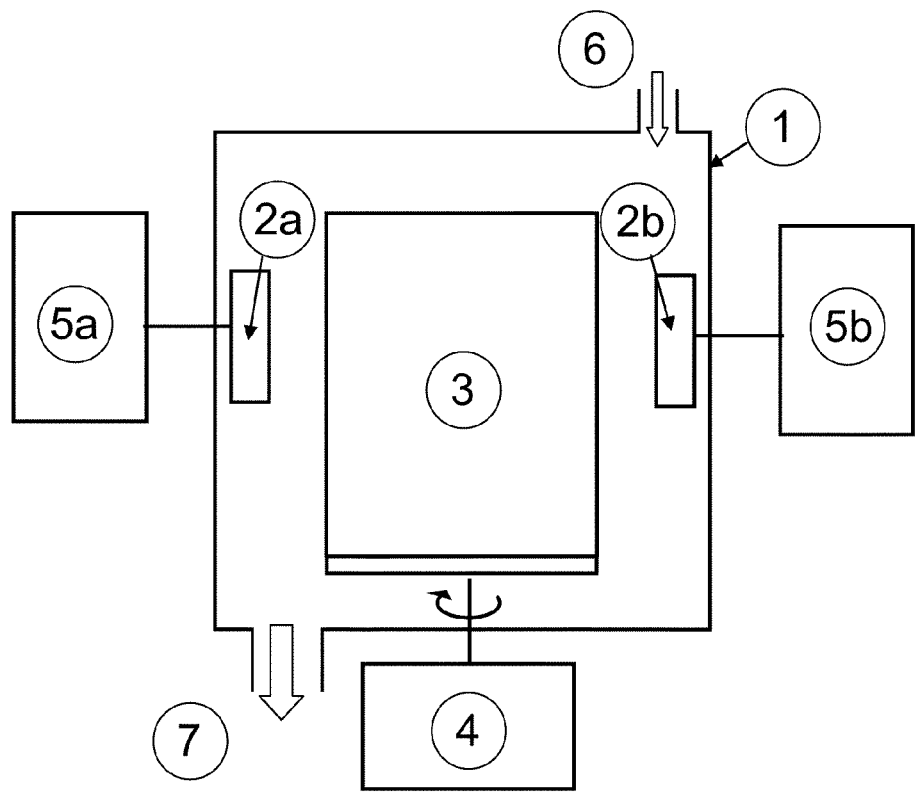
FIG. 2a; Schematic view (side view) of the deposition chamber showing (1) vacuum chamber, (2a) cathode material A, (2b) cathode material B, (3) fixture, (4) power supply for biasing, (5a) cathodic arc power supply (5b) cathodic arc power supply, (6) inlet for process gas and (7) outlet for vacuum pump.
Figure 2B:
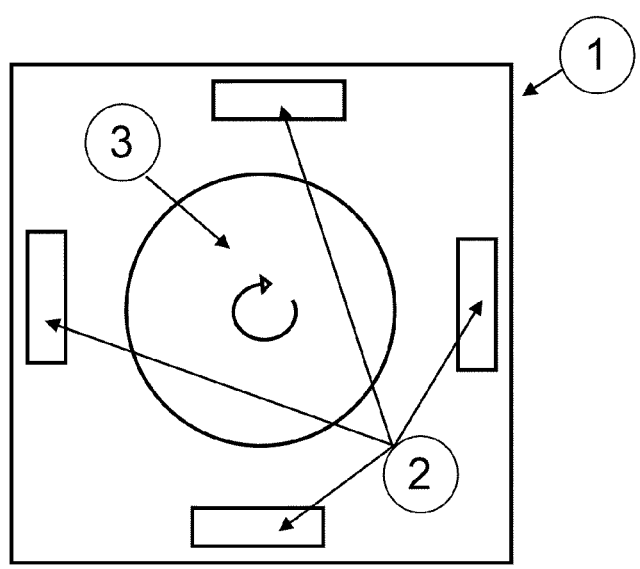
FIG. 2b; Schematic view (top view) of the deposition chamber showing (1) vacuum chamber, (2) four positions for different cathode materials and (3) fixture.

Example 1 was repeated but using a pure Ta cathode (63 mm in diameter, position (2b) in FIG. 2a) for growth of the TaN layers.

The total average composition of the coatings was estimated by energy dispersive spectroscopy (EDS) analysis (see example 1) and summarized in tab 2.

TABLE 2

| Sample | $d_{TaN}$ (nm) | $d_{(Ti,Al)N}$ (nm) | $\lambda$ (nm) | N | Total coating thickness (μm) | Ta (at %) | Ti (at %) | Al (at %) | N (at %) |
|---|---|---|---|---|---|---|---|---|---|
| (Ti, Al)N | | | | | 2.9 | | 18.3 | 31.7 | 50.0 |
| TaN | | | | | 3.1 | 50.2 | | | 49.8 |
| .../TaN/(Ti, Al)N/... | | | | | | | | | |
| 13 | 0.9 | 4.2 | 5.1 | 608 | 3.1 | 8.9 | 14.8 | 26.4 | 50.0 |
| 14 | 2.4 | 2.4 | 4.8 | 625 | 3.0 | 25.1 | 9.0 | 16.0 | 49.9 |
| 15 | 4.0 | 1.1 | 5.1 | 588 | 3.0 | 39.4 | 3.9 | 6.9 | 49.8 |
| 16 | 2.0 | 8.1 | 10.1 | 287 | 2.9 | 9.9 | 14.4 | 25.7 | 50.0 |
| 17 | 5.1 | 4.9 | 10.0 | 310 | 3.1 | 25.6 | 8.8 | 15.7 | 49.9 |
| 18 | 8.0 | 2.0 | 10.0 | 290 | 2.9 | 40.2 | 3.6 | 6.4 | 49.8 |
| 19 | 4.1 | 16.2 | 20.3 | 148 | 3.0 | 10.1 | 14.4 | 25.5 | 50.0 |
| 20 | 10.2 | 10.1 | 20.3 | 153 | 3.1 | 25.2 | 9.0 | 15.9 | 49.9 |
| 21 | 15.9 | 4.0 | 19.9 | 141 | 2.8 | 40.1 | 3.6 | 6.4 | 49.8 |
| 22 | 9.9 | 40.1 | 50.0 | 62 | 3.1 | 9.9 | 14.4 | 25.7 | 50.0 |
| 23 | 25.2 | 24.8 | 50.0 | 64 | 3.2 | 25.3 | 8.9 | 15.9 | 49.9 |
| 24 | 40.1 | 10.1 | 50.2 | 60 | 3.0 | 40.1 | 3.6 | 6.4 | 49.8 |

EXAMPLE 3

Example 1 was repeated but using a Ti/Nb (95 at % Ti+5 at % Nb) cathode (63 mm in diameter, position (2b) in FIG. 2a) for growth of the (Ti,Nb)N layers.

The total average composition of the coatings was estimated by energy dispersive spectroscopy (EDS) analysis (see example 1) and summarized in tab 3.

TABLE 3

| Sample | $d_{(Ti,Nb)N}$ (nm) | $d_{(Ti,Al)N}$ (nm) | $\lambda$ (nm) | N | Total coating thickness (μm) | Nb (at %) | Ti (at %) | Al (at %) | N (at %) |
|---|---|---|---|---|---|---|---|---|---|
| (Ti, Al)N | | | | | 2.9 | | 18.3 | 31.7 | 50.0 |
| (Ti, Nb)N | | | | | 3.0 | 2.3 | 47.7 | | 50.0 |
| .../(Ti, Nb)N/(Ti, Al)N/... | | | | | | | | | |
| 25 | 1.0 | 4.1 | 5.1 | 608 | 3.1 | 0.5 | 23.8 | 25.7 | 50.0 |
| 26 | 2.5 | 2.6 | 5.1 | 569 | 2.9 | 1.1 | 32.6 | 16.3 | 50.0 |
| 27 | 4.1 | 1.1 | 5.2 | 558 | 2.9 | 1.8 | 41.4 | 6.8 | 50.0 |
| 28 | 2.2 | 8.2 | 10.4 | 288 | 3.0 | 0.5 | 24.3 | 25.2 | 50.0 |
| 29 | 5.1 | 5.0 | 10.1 | 287 | 2.9 | 1.2 | 33.0 | 15.8 | 50.0 |
| 30 | 7.9 | 1.9 | 9.8 | 306 | 3.0 | 1.9 | 41.9 | 6.2 | 50.0 |
| 31 | 4.1 | 16.0 | 20.1 | 134 | 2.7 | 0.5 | 24.1 | 25.5 | 50.0 |
| 32 | 10.1 | 9.8 | 19.9 | 156 | 3.1 | 1.2 | 33.1 | 15.8 | 50.0 |

TABLE 3-continued

| Sample | $d_{(Ti,Nb)N}$ (nm) | $d_{(Ti,Al)N}$ (nm) | $\lambda$ (nm) | N | Total coating thickness (μm) | Nb (at %) | Ti (at %) | Al (at %) | N (at %) |
|---|---|---|---|---|---|---|---|---|---|
| 33 | 16.2 | 3.9 | 20.1 | 144 | 2.9 | 1.9 | 41.9 | 6.2 | 50.0 |
| 34 | 9.9 | 40.1 | 50.0 | 62 | 3.1 | 0.5 | 23.9 | 25.7 | 50.0 |
| 35 | 25.0 | 24.9 | 49.9 | 60 | 3.0 | 1.2 | 32.9 | 16.0 | 50.0 |
| 36 | 39.6 | 10.1 | 49.7 | 56 | 2.8 | 1.8 | 41.7 | 6.5 | 50.0 |

EXAMPLE 4

Example 1 was repeated but using a pure Nb cathode (63 mm in diameter, position (2b) in FIG. 2a) for growth of the NbN layers.

The total average composition of the coatings was estimated by energy dispersive spectroscopy (EDS) analysis (see example 1) and summarized in tab 4.

TABLE 4

| Sample | $d_{NbN}$ (nm) | $d_{(Ti,Al)N}$ (nm) | $\lambda$ (nm) | N | Total coating thickness (μm) | Nb (at %) | Ti (at %) | Al (at %) | N (at %) |
|---|---|---|---|---|---|---|---|---|---|
| (Ti, Al)N | | | | | 2.9 | | 18.3 | 31.7 | 50.0 |
| NbN | | | | | 3.2 | 49.9 | | | 50.1 |
| . . . /NbN/(Ti, Al)N/ . . . | | | | | | | | | |
| 37 | 1.0 | 4.0 | 5.0 | 540 | 2.7 | 10.0 | 14.4 | 25.6 | 50.0 |
| 38 | 2.4 | 2.7 | 5.1 | 549 | 2.8 | 23.5 | 9.5 | 16.9 | 50.0 |
| 39 | 4.1 | 1.2 | 5.3 | 547 | 2.9 | 38.6 | 4.1 | 7.2 | 50.1 |
| 40 | 2.1 | 8.3 | 10.4 | 298 | 3.1 | 10.1 | 14.4 | 25.5 | 50.0 |
| 41 | 5.1 | 4.7 | 9.8 | 286 | 2.8 | 26.0 | 8.6 | 15.3 | 50.1 |
| 42 | 8.0 | 2.1 | 10.1 | 307 | 3.1 | 39.5 | 3.7 | 6.7 | 50.1 |
| 43 | 4.0 | 15.8 | 19.8 | 157 | 3.1 | 10.1 | 14.4 | 25.5 | 50.0 |
| 44 | 9.9 | 8.9 | 18.8 | 149 | 2.8 | 26.3 | 8.5 | 15.1 | 50.1 |
| 45 | 15.8 | 4.0 | 19.8 | 141 | 2.8 | 39.8 | 3.6 | 6.5 | 50.1 |
| 46 | 10.0 | 39.4 | 49.4 | 57 | 2.8 | 10.1 | 14.4 | 25.5 | 50.0 |
| 47 | 24.5 | 25.0 | 49.5 | 63 | 3.1 | 24.7 | 9.1 | 16.2 | 50.0 |
| 48 | 41.0 | 9.8 | 50.8 | 57 | 2.9 | 40.3 | 3.5 | 6.2 | 50.1 |

EXAMPLE 5

Example 1 was repeated but using a pure Zr cathode (63 mm in diameter, position (2b) in FIG. 2a) for growth of the ZrN layers.

The total average composition of the coatings was estimated by energy dispersive spectroscopy (EDS) analysis (see example 1) and summarized in tab 5.

TABLE 5

| Sample | $d_{ZrN}$ (nm) | $d_{(Ti,Al)N}$ (nm) | $\lambda$ (nm) | N | Total coating thickness (μm) | Zr (at %) | Ti (at %) | Al (at %) | N (at %) |
|---|---|---|---|---|---|---|---|---|---|
| (Ti, Al)N | | | | | 2.9 | | 18.3 | 31.7 | 50.0 |
| ZrN | | | | | 3.0 | 50.7 | | | 49.3 |
| . . . /ZrN/(Ti, Al)N/ . . . | | | | | | | | | |
| 49 | 1.0 | 3.8 | 4.8 | 604 | 2.9 | 10.6 | 14.3 | 25.3 | 49.9 |
| 50 | 2.6 | 2.2 | 4.8 | 560 | 2.7 | 27.5 | 8.3 | 14.7 | 49.6 |
| 51 | 3.9 | 1.1 | 5.0 | 560 | 2.8 | 39.5 | 4.0 | 7.0 | 49.5 |
| 52 | 2.1 | 8.3 | 10.4 | 288 | 3.0 | 10.2 | 14.4 | 25.5 | 49.9 |
| 53 | 5.0 | 5.1 | 10.1 | 287 | 2.9 | 25.1 | 9.1 | 16.2 | 49.7 |
| 54 | 7.8 | 2.4 | 10.2 | 284 | 2.9 | 38.8 | 4.2 | 7.5 | 49.5 |
| 55 | 3.9 | 16.0 | 19.9 | 156 | 3.1 | 9.9 | 14.5 | 25.7 | 49.9 |
| 56 | 10.0 | 9.7 | 19.7 | 152 | 3.0 | 25.7 | 8.9 | 15.8 | 49.6 |
| 57 | 16.1 | 3.5 | 19.6 | 153 | 3.0 | 41.6 | 3.2 | 5.7 | 49.4 |
| 58 | 9.8 | 39.4 | 49.2 | 59 | 2.9 | 10.1 | 14.4 | 25.6 | 49.9 |
| 59 | 25.5 | 25.0 | 50.5 | 59 | 3.0 | 25.6 | 8.9 | 15.8 | 49.6 |
| 60 | 40.0 | 10.0 | 50.0 | 58 | 2.9 | 40.6 | 3.6 | 6.4 | 49.4 |

EXAMPLE 6

Example 2 was repeated but using a pure V cathode (63 mm in diameter, position (2b) in FIG. 2a) for growth of the VN layers.

The total average composition of the coatings was estimated by energy dispersive spectroscopy (EDS) analysis (see example 1) and summarized in tab 6.

TABLE 6

| Sample | $d_{VN}$ (nm) | $d_{(Ti,Al)N}$ (nm) | $\lambda$ (nm) | N | Total coating thickness (μm) | V (at %) | Ti (at %) | Al (at %) | N (at %) |
|---|---|---|---|---|---|---|---|---|---|
| (Ti, Al)N | | | | | 2.9 | | 18.3 | 31.7 | 50.0 |
| VN | | | | | 3.3 | 51.3 | | | 48.7 |
| . . . VN/(Ti, Al)N/ . . . | | | | | | | | | |
| 61 | 0.8 | 4.2 | 5.0 | 600 | 3.0 | 8.2 | 15.1 | 26.9 | 49.8 |
| 62 | 2.3 | 2.8 | 5.1 | 608 | 3.1 | 23.1 | 9.9 | 17.6 | 49.4 |
| 63 | 3.9 | 1.2 | 5.1 | 608 | 3.1 | 39.2 | 4.2 | 7.5 | 49.0 |
| 64 | 2.0 | 8.3 | 10.3 | 262 | 2.7 | 10.0 | 14.5 | 25.8 | 49.7 |
| 65 | 5.0 | 5.4 | 10.4 | 279 | 2.9 | 24.7 | 9.3 | 16.6 | 49.4 |
| 66 | 7.8 | 2.8 | 10.6 | 292 | 3.1 | 37.7 | 4.8 | 8.5 | 49.0 |
| 67 | 3.8 | 16.0 | 19.8 | 162 | 3.2 | 9.8 | 14.5 | 25.9 | 49.8 |
| 68 | 10.0 | 9.7 | 19.7 | 157 | 3.1 | 26.0 | 8.9 | 15.8 | 49.3 |
| 69 | 16.4 | 3.5 | 19.9 | 146 | 2.9 | 42.3 | 3.2 | 5.6 | 48.9 |
| 70 | 10.4 | 41.0 | 51.4 | 54 | 2.8 | 10.4 | 14.4 | 25.5 | 49.7 |
| 71 | 24.8 | 26.5 | 51.3 | 57 | 2.9 | 24.8 | 9.3 | 16.5 | 49.4 |
| 72 | 39.0 | 10.5 | 49.5 | 57 | 2.8 | 40.4 | 3.8 | 6.8 | 49.0 |

EXAMPLE 7

Example 2 was repeated but using a Al/Ti (95 at % Al+5 at % Ti) cathode (63 mm in diameter, position (2b) in FIG. 2a) for growth of the (Al,Ti)N layers.

The total average composition of the coatings was estimated by energy dispersive spectroscopy (EDS) analysis (see example 1) and summarized in tab 7.

TABLE 7

| Sample | $d_{(Ti,Al)N-L1}$ (nm) | $d_{(Ti,Al)N-L2}$ (nm) | $\lambda$ (nm) | N | Total coating thickness (μm) | Ti (at %) | Al (at %) | N (at %) |
|---|---|---|---|---|---|---|---|---|
| (Ti, Al)N-L1 | | | | | 2.9 | 18.3 | 31.7 | 50.0 |
| (Ti, Al)N-L2 | | | | | 3.2 | 46.4 | 3.6 | 49.8 |
| . . . /(Ti, Al)N-L2/(Ti, Al)N-L1/ . . . | | | | | | | | |
| 73 | 1.0 | 3.9 | 4.9 | 633 | 3.1 | 23.8 | 26.2 | 50.0 |
| 74 | 2.5 | 2.6 | 5.1 | 569 | 2.9 | 31.9 | 18.2 | 49.9 |
| 75 | 4.0 | 0.8 | 4.8 | 604 | 2.9 | 41.7 | 8.5 | 49.8 |
| 76 | 2.1 | 8.1 | 10.2 | 294 | 3.0 | 23.8 | 26.2 | 50.0 |
| 77 | 5.1 | 4.9 | 10.0 | 290 | 2.9 | 32.5 | 17.6 | 49.9 |
| 78 | 8.1 | 1.8 | 9.9 | 303 | 3.0 | 41.2 | 8.9 | 49.8 |
| 79 | 3.9 | 15.8 | 19.7 | 137 | 2.7 | 23.6 | 26.4 | 50.0 |
| 80 | 9.9 | 11.0 | 20.9 | 148 | 3.1 | 31.5 | 18.6 | 49.9 |
| 81 | 15.9 | 4.2 | 20.1 | 144 | 2.9 | 40.5 | 9.7 | 49.8 |
| 82 | 10.1 | 39.8 | 49.9 | 62 | 3.1 | 23.7 | 26.3 | 50.0 |
| 83 | 25.1 | 24.9 | 50.0 | 60 | 3.0 | 32.3 | 17.8 | 49.9 |
| 84 | 40.1 | 9.4 | 49.5 | 57 | 2.8 | 41.0 | 9.2 | 49.8 |

EXAMPLE 8

Inserts from example 1 were tested according to:
Geometry: CNMG120408-MF1
Application: Continuous turning
Work piece material: AISI 316L
Cutting speed: 230 m/min
Feed: 0.15 mm/rev
Depth of cut: 1 mm
Tool life criteria, flank wear (vb)>0.3 mm
Result of test

TABLE 8

| Sample | $d_{TiN}$ (nm) | $d_{(Ti,Al)N}$ (nm) | $\lambda$ (nm) | N | Total coating thickness (μm) | Tool life (min) |
|---|---|---|---|---|---|---|
| (Ti, Al)N | | | | | 2.9 | 18.2 |
| TiN | | | | | 3.2 | 9.3 |
| .../TiN/(Ti, Al)N/... | | | | | | |
| 1 | 1.1 | 4.0 | 5.1 | 569 | 2.9 | 20.8 |
| 2 | 2.4 | 2.5 | 4.9 | 633 | 3.1 | 18.7 |
| 3 | 3.9 | 0.9 | 4.8 | 625 | 3.0 | 12.8 |
| 4 | 2.0 | 7.9 | 9.9 | 313 | 3.1 | 22.1 |
| 5 | 5.1 | 5.0 | 10.1 | 287 | 2.9 | 18 |
| 6 | 8.1 | 2.1 | 10.2 | 294 | 3.0 | 12.9 |
| 7 | 4.1 | 15.9 | 20.0 | 163 | 3.3 | 19.5 |
| 8 | 10.4 | 10.1 | 20.5 | 161 | 3.3 | 16.5 |
| 9 | 16.2 | 3.8 | 20.0 | 168 | 3.4 | 11.8 |
| 10 | 10.1 | 39.5 | 49.6 | 69 | 3.4 | 18.5 |
| 11 | 24.8 | 25.1 | 49.9 | 69 | 3.5 | 16.3 |
| 12 | 40.2 | 10.1 | 50.3 | 70 | 3.5 | 11.1 |
| 13 | 21.5 | 79.0 | 100.5 | 35 | 3.6 | 18.1 |
| 14 | 49.2 | 50.4 | 99.6 | 36 | 3.6 | 14.4 |
| 15 | 81.2 | 19.2 | 100.4 | 36 | 3.7 | 11 |

EXAMPLE 9

Inserts from example 1 were tested according to:
Geometry: CNMG120412-MR3
Application: Continuous turning
Work piece material: Inconel 718,
Cutting speed: 90 m/min
Feed: 0.2 mm/rev
Depth of cut: 0.5 mm
Tool life criteria, flank wear (vb)>0.2 mm
Result of test

TABLE 9

| Sample | $d_{TiN}$ (nm) | $d_{(Ti,Al)N}$ (nm) | $\lambda$ (nm) | N | Total coating thickness (μm) | Tool life (min) |
|---|---|---|---|---|---|---|
| (Ti, Al)N | | | | | 2.9 | 10.9 |
| TiN | | | | | 3.2 | 5.2 |
| .../TiN/(Ti, Al)N/... | | | | | | |
| 1 | 1.1 | 4.0 | 5.1 | 569 | 2.9 | 12.5 |
| 2 | 2.4 | 2.5 | 4.9 | 633 | 3.1 | 9.6 |
| 3 | 3.9 | 0.9 | 4.8 | 625 | 3.0 | 7.1 |
| 4 | 2.0 | 7.9 | 9.9 | 313 | 3.1 | 12.2 |
| 5 | 5.1 | 5.0 | 10.1 | 287 | 2.9 | 10.1 |
| 6 | 8.1 | 2.1 | 10.2 | 294 | 3.0 | 7.5 |
| 7 | 4.1 | 15.9 | 20.0 | 163 | 3.3 | 11.2 |
| 8 | 10.4 | 10.1 | 20.5 | 161 | 3.3 | 8.9 |
| 9 | 16.2 | 3.8 | 20.0 | 168 | 3.4 | 7.9 |
| 10 | 10.1 | 39.5 | 49.6 | 69 | 3.4 | 10.8 |
| 11 | 24.8 | 25.1 | 49.9 | 69 | 3.5 | 7.5 |
| 12 | 40.2 | 10.1 | 50.3 | 70 | 3.5 | 7.1 |
| 13 | 21.5 | 79.0 | 100.5 | 35 | 3.6 | 8.2 |
| 14 | 49.2 | 50.4 | 99.6 | 36 | 3.6 | 6.2 |
| 15 | 81.2 | 19.2 | 100.4 | 36 | 3.7 | 6.2 |

EXAMPLE 10

Inserts from example 5 were tested according to:
Geometry: CNMG120408-MF1
Application: Continuous turning
Work piece material: AISI 316L
Cutting speed: 250 m/min
Feed: 0.15 mm/rev
Depth of cut: 1 mm
Tool life criteria, flank wear (vb)>0.3 mm
Result of test

TABLE 10

| Sample | $d_{ZrN}$ (nm) | $d_{(Ti,Al)N}$ (nm) | $\lambda$ (nm) | N | Total coating thickness (μm) | Tool life (min) |
|---|---|---|---|---|---|---|
| (Ti, Al)N | | | | | 2.9 | 18.2 |
| ZrN | | | | | 3.0 | 9.7 |
| .../ZrN/(Ti, Al)N/... | | | | | | |
| 49 | 1.0 | 3.8 | 4.8 | 604 | 2.9 | 20.4 |
| 50 | 2.6 | 2.2 | 4.8 | 560 | 2.7 | 17.5 |
| 51 | 3.9 | 1.1 | 5.0 | 560 | 2.8 | 11.9 |
| 52 | 2.1 | 8.3 | 10.4 | 288 | 3.0 | 21.6 |
| 53 | 5.0 | 5.1 | 10.1 | 287 | 2.9 | 16.9 |
| 54 | 7.8 | 2.4 | 10.2 | 284 | 2.9 | 11.8 |
| 55 | 3.9 | 16.0 | 19.9 | 156 | 3.1 | 18.9 |
| 56 | 10.0 | 9.7 | 19.7 | 152 | 3.0 | 15.6 |
| 57 | 16.1 | 3.5 | 19.6 | 153 | 3.0 | 10.9 |
| 58 | 9.8 | 39.4 | 49.2 | 59 | 2.9 | 18.3 |
| 59 | 25.5 | 25.0 | 50.5 | 59 | 3.0 | 15.4 |
| 60 | 40.0 | 10.0 | 50.0 | 58 | 2.9 | 10.4 |

EXAMPLE 11

Figure 6:
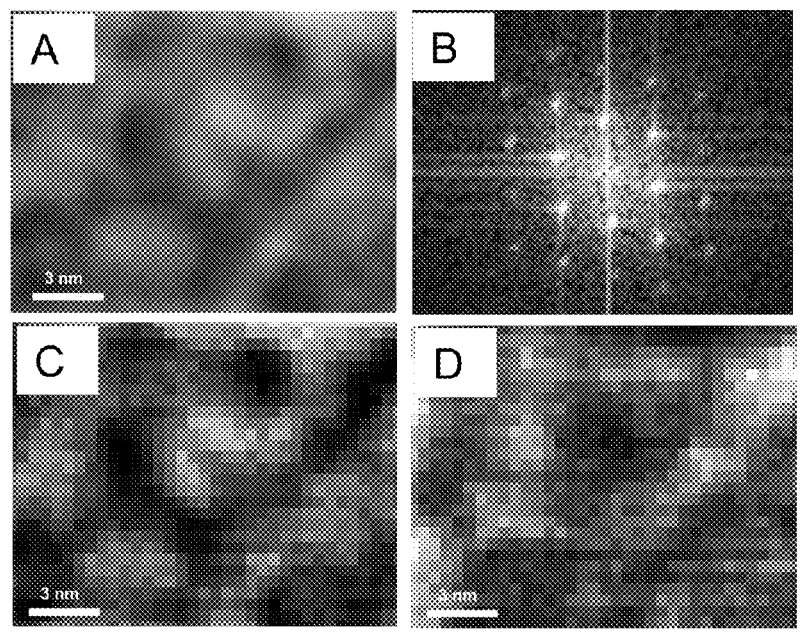
FIG. 6; STEM micrographs of a TiN/(Ti,Al)N multilayer coating of TiN (2 nm) and (Ti,Al)N (7.9 nm) showing (A) the (Ti,Al)N layer, (B) electron diffraction pattern over the region in (A), (C) Ti EDS map (bright contrast) and (D) Al EDS map (bright contrast).

A used insert from example 8 was studied in more detail by TEM including electron diffraction, STEM and EDS. FIG. 6 (A) shows a STEM micrographs of the coating of sample 4 (Tab 1). The image shows TiN rich regions (brighter contrast) and AlN rich regions (darker contrast). This is further verified by the EDS mapping in (C) and (D) showing the EDS maps of Ti (bright areas show Ti rich regions) and Al (bright areas show Al rich regions), respectively. Further, the typical size of the Ti and Al rich regions is on the order of 5 nm. Selected area electron diffraction patterns (B) show coherency and cubic structure over the layered structure.

The invention claimed is:

1. A cutting tool for machining by chip removal, comprising:
a body of a hard alloy of cemented carbide, cermet, ceramics, cubic boron nitride based material or high speed steel; and
a hard and wear resistant coating,
wherein said coating comprises a polycrystalline laminar, multilayered structure of metal nitride compounds, in a repetitive form ... MeN/$Ti_{1-x}Al_x$)N/MeN/($Ti_{1-x}Al_x$)N/

MeN/(Ti$_{1-x}$Al$_x$)N/MeN/(Ti$_{1-x}$Al$_x$)N . . . of cubic structured (Ti$_{1-x}$Al$_x$)N layers where 0.3<x<0.95 and cubic structured MeN layers where Me is one or more of the metal element Ti, Zr, Hf, V, Nb, Ta, Mo and Al with a repeat period, λ, that is essentially constant throughout the entire laminated structure having a total thickness between 0.5 and 20 μm, a repeat period, λ, of 5 nm≦λ<20 nm, and layer thickness relation of 1/10<(d$_{MeN}$/d$_{(Ti,Al)N}$)<1/3, where the thickness d$_{MeN}$ is larger than d$_{MeN}$≧1 nm.

2. The cutting tool according to claim 1, wherein x has a value of 0.45<x<0.75, the total thickness ranges between 1 to 10 μm, and the repeat period λ has a value 5 nm≦λ≦10 nm.

3. The cutting tool according to claim 1, wherein Me is Ti.

4. The cutting tool according to claim 1, wherein Me is Zr.

5. The cutting tool according to claim 1, wherein Me is V.

6. The cutting tool according to claim 1, wherein Me is Nb.

7. The cutting tool according to claim 1, wherein Me is Ta.

8. The cutting tool according to claim 1, wherein Me is Al.

9. The cutting tool according to claim 1, wherein Me is two or more of the metal elements Ti, V, Nb or Al.

10. The cutting tool according to claim 1, wherein Me is two or more of the metal elements Zr, V, Nb or Ta.

11. The cutting tool according to claim 1, wherein Me is two or more of the metal elements Ti, Zr, V or Nb.

12. The cutting tool according to claim 1, wherein Me is two or more of the metal elements Zr, V or Nb.

13. The cutting tool according to claim 2, wherein the total thickness of the multilayer coating is 2-10 μm.

14. The cutting tool according to claim 1, wherein the MeN layer has a compressive stress level between −12.0<σ(MeN)<−3.0 GPa whereas the (Ti$_{1-x}$Al$_x$)N layer has a stress level varying between −6.0<σ((Ti$_{1-x}$Al$_x$)N)<−0.5 GPa.

15. The cutting tool according to claim 1, wherein the average composition of the MeN/(Ti$_{1-x}$Al$_x$)N multilayer coating is 46 at %<Zr+Hf+V+Nb+Ta+Mo+Ti+Al<54 at %, and balance N.

16. The cutting tool according to the claim 1, wherein said coating has been deposited with PVD or cathodic arc evaporation.

17. The cutting tool according to claim 1, wherein said body is coated with an inner single- and/or multilayer coating of TiN, TiC, Ti(C,N) or (Ti,Al)N, and/or an outer single- and/or multilayer coating of TiN, TiC, Ti(C,N) or (Ti,Al)N, to a total thickness 1 to 20 μm.

18. A method of making the cutting tool according to claim 1, comprising:
growing the layers by cathodic arc evaporation using pure and/or alloyed Ti+Al and Me cathodes to yield the desired layer composition, with an evaporation current between 50 A and 200 A, in an Ar+N$_2$ atmosphere, at a total pressure of 0.5 Pa to 9.0 Pa, with a bias between −10 V and −300 V, and at a temperature between 350° C. and 700° C.

19. The cutting tool according to claim 1, wherein the MeN layers provide a predominantly overall cubic coating structure that suppresses the formation of hexagonal AlN phases.

20. The method according to claim 18, wherein the MeN layers provide a predominantly overall cubic coating structure that suppresses the formation of hexagonal AlN phases.

21. A cutting tool for machining by chip removal, comprising:
a body of a hard alloy of cemented carbide, cermet, ceramics, cubic boron nitride based material or high speed steel; and
a hard and wear resistant coating,
wherein said coating comprises a polycrystalline laminar, multilayered structure of metal nitride compounds, in a repetitive form . . . MeN/(Ti$_{1-x}$Al$_x$)N/MeN/(Ti$_{1-x}$Al$_x$)N/MeN/(Ti$_{1-x}$Al$_x$)N/MeN/(Ti$_{1-x}$Al$_x$)N . . . of cubic structured (Ti$_{1-x}$Al$_x$)N layers where 0.3<x<0.95 and cubic structured MeN layers where Me is one or more of the metal element Ti, Zr, Hf, V, Nb, Ta, Mo and Al with a repeat period, λ, that is essentially constant throughout the entire laminated structure having a total thickness between 0.5 and 20 μm, a repeat period, λ, of 5 nm≦λ<15 nm, and layer thickness relation of 1/10<(d$_{MeN}$/d$_{(Ti,Al)N}$)<1/3, where the thickness d$_{MeN}$ is larger than d$_{MeN}$≧1 nm.

* * * * *

UNITED STATES PATENT AND TRADEMARK OFFICE
CERTIFICATE OF CORRECTION

PATENT NO. : 8,409,696 B2  
APPLICATION NO. : 12/867889  
DATED : April 2, 2013  
INVENTOR(S) : Johansson et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 242 days.

Signed and Sealed this

First Day of September, 2015

Michelle K. Lee
*Director of the United States Patent and Trademark Office*